United States Patent
Wright et al.

(10) Patent No.: US 9,848,512 B2
(45) Date of Patent: *Dec. 19, 2017

(54) HEAT DISSIPATION FOR SUBSTRATE ASSEMBLIES

(71) Applicant: SanDisk Technologies LLC, Plano, TX (US)

(72) Inventors: David A. Wright, Sun Tan Valley, AZ (US); David Dean, Litchfield Park, AZ (US); Robert W. Ellis, Phoenix, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/342,073

(22) Filed: Nov. 2, 2016

(65) Prior Publication Data
US 2017/0064870 A1    Mar. 2, 2017

Related U.S. Application Data

(63) Continuation of application No. 14/275,690, filed on May 12, 2014, now Pat. No. 9,497,889.
(Continued)

(51) Int. Cl.
*H05K 7/00* (2006.01)
*H05K 7/20* (2006.01)
(Continued)

(52) U.S. Cl.
CPC ....... *H05K 7/20709* (2013.01); *H05K 1/0203* (2013.01); *H05K 1/0207* (2013.01);
(Continued)

(58) Field of Classification Search
CPC .................................................. H05K 7/20
(Continued)

(56) References Cited

U.S. PATENT DOCUMENTS

| 4,519,016 A | 5/1985 | Bradley et al. |
| 4,839,587 A | 6/1989 | Flatley et al. |

(Continued)

FOREIGN PATENT DOCUMENTS

| CN | 201 655 782 | 11/2010 |
| CN | 102 446 873 | 5/2012 |

(Continued)

OTHER PUBLICATIONS

International Search Report and Written Opinion dated Dec. 16, 2014, received in International Patent Application No. PCT/US2014/059114, which corresponds to U.S. Appl. No. 14/135,223, 9 pages (Dean).

(Continued)

*Primary Examiner* — Jerry Wu
(74) *Attorney, Agent, or Firm* — Morgan, Lewis & Bockius LLP

(57) ABSTRACT

Various embodiments described herein include systems, methods and/or devices used to dissipate heat generated by electronic components in an electronic system (e.g., a memory system including closely spaced memory modules). Specifically, a heat sink includes an attachment structure and a tab. The attachment structure defines a slot configured to receive an edge of a substrate and thermally couple to a ground plane of the substrate. The tab is located opposite to the slot, and is configured to slide into a card guide slot of an assembly rack, such that in use, heat generated by at least one electronic component on the substrate is at least partially transferred through the ground plane to the attachment structure to be dissipated.

20 Claims, 7 Drawing Sheets

Related U.S. Application Data

(60) Provisional application No. 61/945,674, filed on Feb. 27, 2014.

(51) Int. Cl.
  *H05K 1/02* (2006.01)
  *H05K 1/18* (2006.01)
  *H05K 7/14* (2006.01)

(52) U.S. Cl.
  CPC ......... *H05K 1/0254* (2013.01); *H05K 1/0259* (2013.01); *H05K 1/181* (2013.01); *H05K 7/1489* (2013.01); *H05K 7/205* (2013.01); *H05K 7/2039* (2013.01); *H05K 2201/066* (2013.01); *H05K 2201/10159* (2013.01)

(58) Field of Classification Search
  USPC .................................................... 361/679.33
  See application file for complete search history.

(56) References Cited

U.S. PATENT DOCUMENTS

| | | |
|---|---|---|
| 5,210,680 A | 5/1993 | Scheibler |
| 5,334,798 A | 8/1994 | Kalis |
| 5,489,805 A | 2/1996 | Hackitt et al. |
| 5,628,031 A | 5/1997 | Kikinis et al. |
| 5,705,850 A | 1/1998 | Ashiwake et al. |
| 5,763,950 A | 6/1998 | Fujisaki et al. |
| 5,828,549 A | 10/1998 | Gandre et al. |
| 5,923,532 A | 7/1999 | Nedved |
| 5,946,190 A | 8/1999 | Patel et al. |
| 5,973,920 A | 10/1999 | Altic et al. |
| 6,008,987 A | 12/1999 | Gale et al. |
| 6,009,938 A | 1/2000 | Smith et al. |
| 6,031,730 A | 2/2000 | Kroske |
| 6,058,012 A | 5/2000 | Cooper et al. |
| 6,061,245 A | 5/2000 | Ingraham et al. |
| 6,084,773 A | 7/2000 | Nelson et al. |
| 6,335,862 B1 | 1/2002 | Koya |
| 6,411,511 B1 | 6/2002 | Chen |
| 6,507,101 B1 | 1/2003 | Morris |
| 6,528,878 B1 | 3/2003 | Daikoku et al. |
| 6,541,310 B1 | 4/2003 | Lo et al. |
| 6,570,762 B2 | 5/2003 | Cross et al. |
| 6,618,249 B2 | 9/2003 | Fairchild |
| 6,621,705 B1 | 9/2003 | Ballenger et al. |
| 6,715,018 B2 | 3/2004 | Farnworth et al. |
| 6,762,942 B1 | 7/2004 | Smith |
| 6,892,801 B1 | 5/2005 | Kim |
| 6,934,152 B1 | 8/2005 | Barrow |
| 6,997,720 B2 | 2/2006 | Perret et al. |
| 7,030,482 B2 | 4/2006 | Haines |
| 7,075,788 B2 | 7/2006 | Larson et al. |
| 7,079,972 B1 | 7/2006 | Wood et al. |
| 7,233,501 B1 | 6/2007 | Ingalz |
| 7,280,364 B2 | 10/2007 | Harris et al. |
| 7,442,050 B1 | 10/2008 | Bhakta et al. |
| 7,474,528 B1 | 1/2009 | Olesiewicz |
| 7,480,147 B2 | 1/2009 | Hoss et al. |
| 7,595,994 B1 | 9/2009 | Sun |
| 7,599,182 B2 | 10/2009 | Sun |
| 7,623,343 B2 | 11/2009 | Chen |
| 7,959,445 B1 | 6/2011 | Daily et al. |
| 7,961,462 B2 | 6/2011 | Hernon |
| 7,980,863 B1 | 7/2011 | Holec et al. |
| 7,989,709 B2 | 8/2011 | Tsao |
| 8,000,096 B2 | 8/2011 | Nemoz et al. |
| 8,116,079 B2 | 2/2012 | Merrow |
| 8,198,539 B2 | 6/2012 | Otoshi et al. |
| 8,208,252 B2 | 6/2012 | Tolliver |
| 8,305,103 B2 | 11/2012 | Kang et al. |
| 8,373,986 B2 | 2/2013 | Sun |
| 8,405,985 B1 | 3/2013 | Reynov et al. |
| 8,472,183 B1 | 6/2013 | Ross et al. |
| 8,477,495 B2 | 7/2013 | Sun |
| 8,570,740 B2 | 10/2013 | Cong et al. |
| 8,599,560 B2 | 12/2013 | Wu et al. |
| 9,089,073 B2 | 7/2015 | Reynov et al. |
| 2002/0008963 A1 | 1/2002 | DiBene, II et al. |
| 2002/0076951 A1 | 6/2002 | Roy |
| 2002/0123259 A1 | 9/2002 | Yatskov et al. |
| 2002/0162039 A1 | 10/2002 | Kirker et al. |
| 2003/0184970 A1 | 10/2003 | Bosch et al. |
| 2004/0059850 A1 | 3/2004 | Hipp |
| 2004/0218367 A1 | 11/2004 | Lin et al. |
| 2004/0246662 A1 | 12/2004 | Thurk et al. |
| 2005/0009382 A1 | 1/2005 | Burmeister et al. |
| 2005/0013120 A1 | 1/2005 | Liu |
| 2005/0082663 A1 | 4/2005 | Wakiyama et al. |
| 2005/0152112 A1 | 7/2005 | Holmes et al. |
| 2006/0042291 A1 | 3/2006 | Petroski |
| 2006/0067054 A1 | 3/2006 | Wang et al. |
| 2006/0067066 A1 | 3/2006 | Meier et al. |
| 2006/0133041 A1 | 6/2006 | Belady et al. |
| 2007/0001282 A1 | 1/2007 | Kang et al. |
| 2007/0057686 A1 | 3/2007 | Suga et al. |
| 2007/0074850 A1 | 4/2007 | Peschl |
| 2007/0097653 A1* | 5/2007 | Gilliland ............... H01L 23/552 361/719 |
| 2007/0121297 A1 | 5/2007 | Uchizono et al. |
| 2007/0145996 A1 | 6/2007 | Shiao et al. |
| 2007/0211426 A1 | 9/2007 | Clayton et al. |
| 2007/0211436 A1 | 9/2007 | Robinson et al. |
| 2007/0216005 A1 | 9/2007 | Yim et al. |
| 2007/0216009 A1 | 9/2007 | Ng |
| 2007/0230111 A1 | 10/2007 | Starr et al. |
| 2007/0246189 A1 | 10/2007 | Lin et al. |
| 2007/0247805 A1 | 10/2007 | Fujie et al. |
| 2007/0293954 A1 | 12/2007 | Pfingsten et al. |
| 2008/0019095 A1 | 1/2008 | Liu |
| 2008/0026637 A1 | 1/2008 | Minich |
| 2008/0037218 A1 | 2/2008 | Sharma et al. |
| 2008/0043435 A1 | 2/2008 | Yip et al. |
| 2008/0052435 A1 | 2/2008 | Norwood et al. |
| 2008/0068796 A1 | 3/2008 | Pav et al. |
| 2008/0116571 A1 | 5/2008 | Dang et al. |
| 2008/0158818 A1 | 7/2008 | Clidaras et al. |
| 2008/0236791 A1 | 10/2008 | Wayman |
| 2008/0252324 A1 | 10/2008 | Barabi et al. |
| 2008/0254573 A1 | 10/2008 | Sir et al. |
| 2008/0266807 A1 | 10/2008 | Lakin et al. |
| 2008/0291636 A1 | 11/2008 | Mori et al. |
| 2009/0190308 A1 | 7/2009 | Bhattacharya et al. |
| 2009/0273898 A1 | 11/2009 | Imsand |
| 2009/0302458 A1 | 12/2009 | Kubo et al. |
| 2009/0309214 A1 | 12/2009 | Szewerenko et al. |
| 2010/0008034 A1 | 1/2010 | Hinkle |
| 2010/0073860 A1 | 3/2010 | Moriai et al. |
| 2010/0073880 A1 | 3/2010 | Liu |
| 2010/0091463 A1 | 4/2010 | Buresch et al. |
| 2010/0118496 A1 | 5/2010 | Lo |
| 2010/0164525 A1 | 7/2010 | Han et al. |
| 2010/0224985 A1 | 9/2010 | Michael et al. |
| 2010/0296255 A1 | 11/2010 | Maloney |
| 2010/0319986 A1 | 12/2010 | Bleau et al. |
| 2010/0328887 A1 | 12/2010 | Refai-Ahmed et al. |
| 2011/0132000 A1 | 6/2011 | Deane et al. |
| 2011/0182035 A1 | 7/2011 | Yajima |
| 2011/0188205 A1 | 8/2011 | MacManus et al. |
| 2011/0299244 A1 | 12/2011 | Dede et al. |
| 2011/0317359 A1 | 12/2011 | Wei et al. |
| 2012/0014067 A1 | 1/2012 | Siracki |
| 2012/0064781 A1 | 3/2012 | Krishnan et al. |
| 2012/0170224 A1* | 7/2012 | Fowler ............... H05K 7/1424 361/720 |
| 2012/0201007 A1 | 8/2012 | Yeh et al. |
| 2012/0293962 A1 | 11/2012 | McCluskey et al. |
| 2012/0327598 A1 | 12/2012 | Nakayama |
| 2013/0155800 A1 | 6/2013 | Shim et al. |
| 2013/0181733 A1 | 7/2013 | Kikuchi et al. |
| 2013/0192887 A1 | 8/2013 | Yaguchi et al. |
| 2013/0285686 A1 | 10/2013 | Malik et al. |
| 2013/0294028 A1 | 11/2013 | Lafont et al. |

(56) References Cited

U.S. PATENT DOCUMENTS

| | | | |
|---|---|---|---|
| 2013/0307060 A1 | 11/2013 | Wang et al. | |
| 2014/0055944 A1 | 2/2014 | McCabe et al. | |
| 2014/0071614 A1 | 3/2014 | Kaldani | |
| 2014/0153181 A1 | 6/2014 | Peng et al. | |
| 2014/0182814 A1 | 7/2014 | Lin | |

FOREIGN PATENT DOCUMENTS

| | | | |
|---|---|---|---|
| DE | 199 10 500 A1 | 10/2000 | |
| DE | 2005 063281 | 7/2007 | |
| EP | 0 600 590 A1 | 6/1994 | |
| EP | 0 989 794 A2 | 3/2000 | |
| EP | 2 066 158 A2 | 6/2009 | |
| EP | 2 395 827 A2 | 12/2011 | |
| EP | 2 600 700 A1 | 6/2013 | |
| FR | 2560731 | 9/1985 | |
| JP | 06006064 | 1/1994 | |
| JP | 2003 188565 | 7/2003 | |
| WO | WO 88 07193 | 3/1988 | |
| WO | WO 03/094586 | 11/2003 | |
| WO | WO 2004/086827 | 10/2004 | |
| WO | WO 2008/013850 | 1/2008 | |
| WO | WO 2013/080341 | 6/2013 | |

OTHER PUBLICATIONS

International Search Report and Written Opinion dated Apr. 28, 2015 received in International Patent Application No. PCT/US2015/014563, which corresponds to U.S. Appl. No. 14/179,247, 9 pages (Ellis).

Invitation to Pay Additional Fees dated Jul. 25, 2014, received in International Patent Application No. PCT/US2014/021290, which corresponds to U.S. Appl. No. 13/791,797, 8 pages (Dean).

International Search Report and Written Opinion dated Nov. 20, 2014, received in International Patent Application No. PCT/US2014/020290, which corresponds to U.S. Appl. No. 13/791,797, 21 pages (Dean).

International Search Report and Written Opinion dated Dec. 23, 2014, received in International Patent Application No. PCT/US2014/042772, which corresponds to U.S. Appl. No. 13/922,105, 10 pages (Dean).

International Search Report and Written Opinion dated May 18, 2015, received in International Patent Application No. PCT/US2015/016656, which corresponds to U.S. Appl. No. 14/275,690, 14 pages (Wright).

International Search Report and Written Opinion dated May 8, 2015, received in International Patent Application No. PCT/US2015/017722, which corresponds to U.S. Appl. No. 14/277,716, 9 pages (Dean).

International Search Report and Written Opinion dated May 13, 2015, received in International Patent Application No. PCT/US2015/017724, which corresponds to U.S. Appl. No. 14/244,734, 12 pages, (Dean).

International Search Report and Written Opinion dated May 28, 2015, received in International Patent Application No. PCT/US2015/017729, which corresponds to U.S. Appl. No. 14/244,745, 14 pages (Ellis).

International Search Report and Written Opinion dated Sep. 12, 2014, received in International Patent Application No. PCT/US2014/043146, which corresponds to U.S. Appl. No. 14/596,176, 12 pages (Dean).

\* cited by examiner

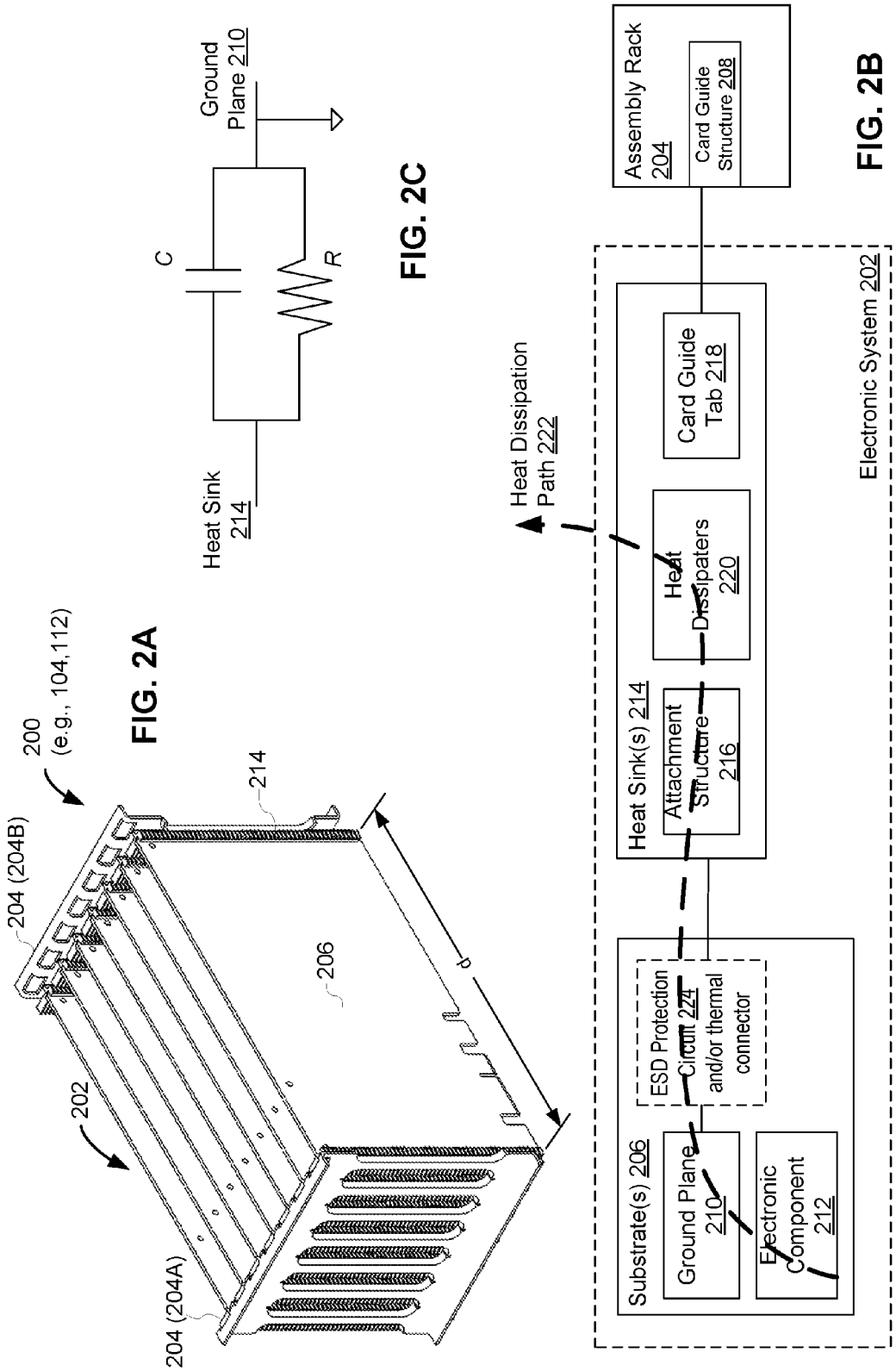

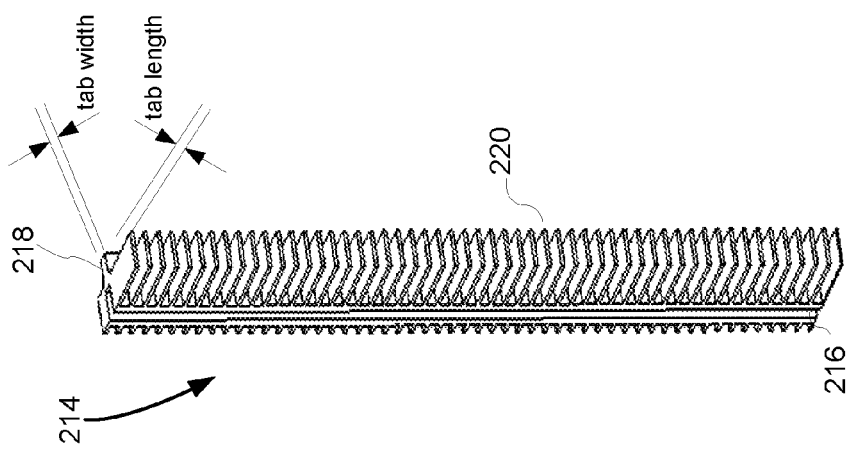
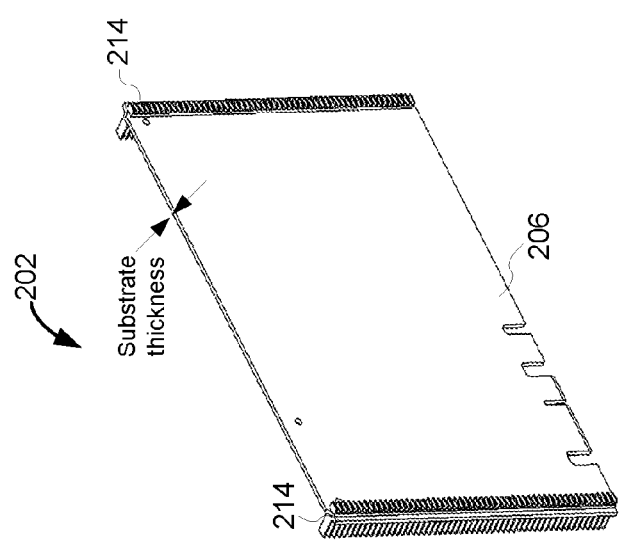
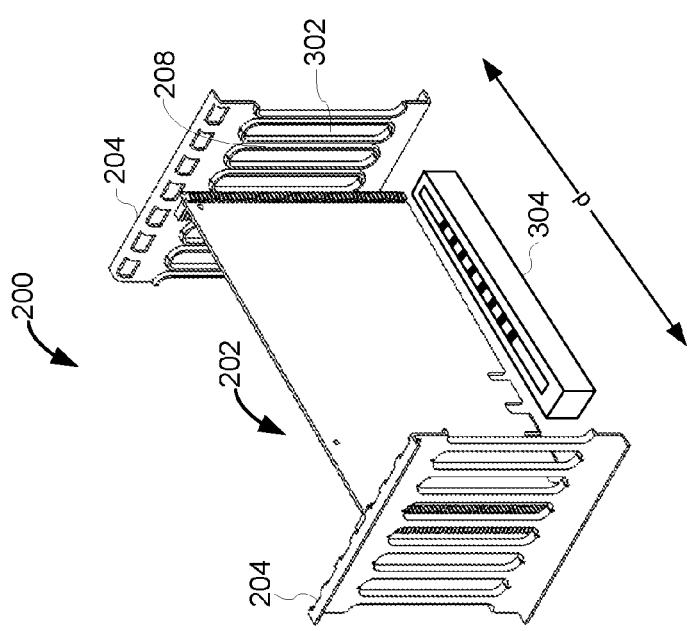
FIG. 3C
FIG. 3B
FIG. 3A

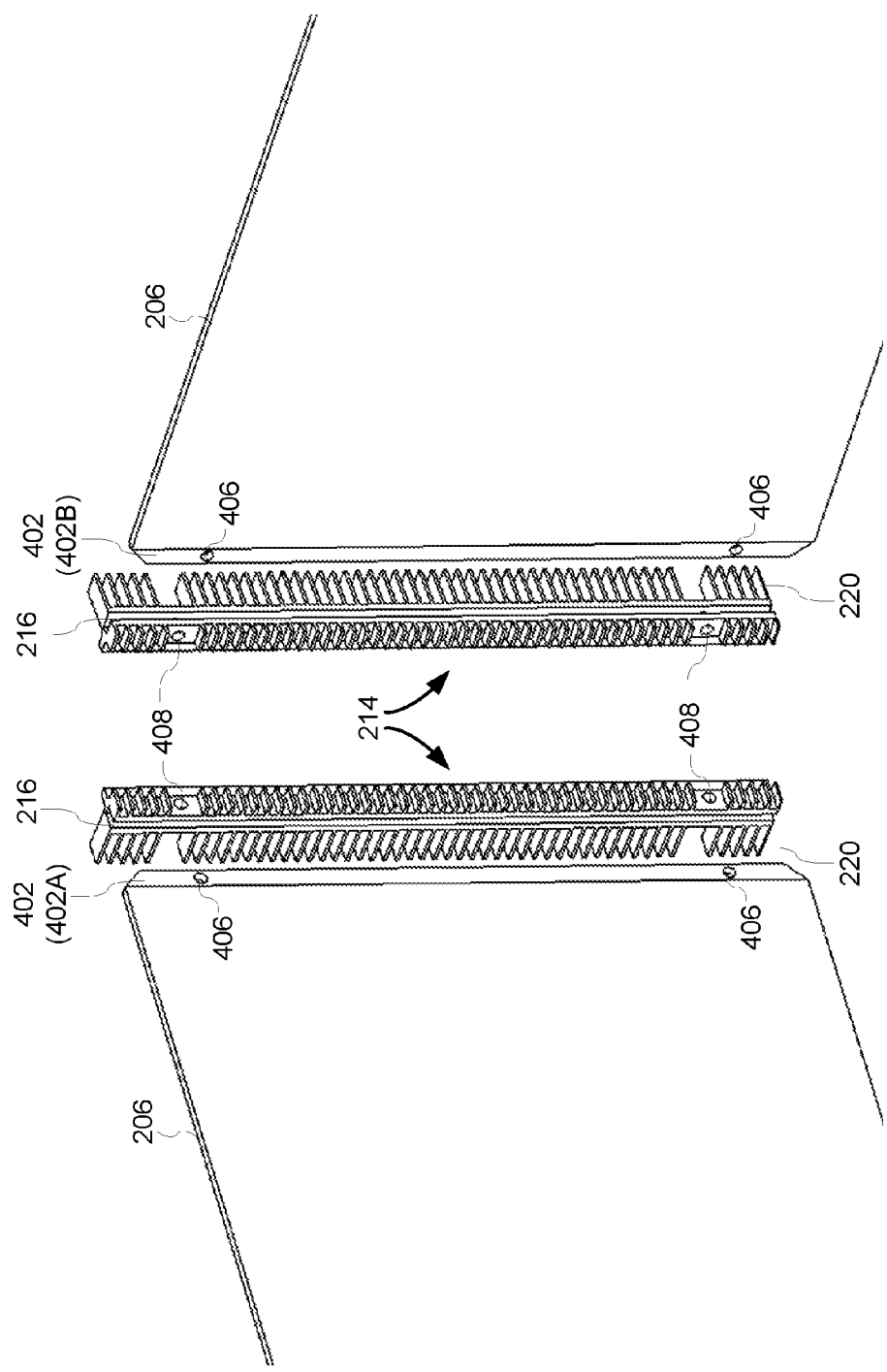

HEAT DISSIPATION FOR SUBSTRATE ASSEMBLIES

RELATED APPLICATIONS

This application is a continuation of and claims priority to U.S. patent application Ser. No. 14/275,690, filed on May 12, 2014, which claims priority to U.S. Provisional Patent Application Ser. No. 61/945,674, filed Feb. 27, 2014, each of which is incorporated herein by reference in its entirety.

TECHNICAL FIELD

The disclosed embodiments relate generally to heat dissipation, and in particular, to dissipating heat generated by electronic components in electronic systems.

BACKGROUND

Many electronic systems include semiconductor memory modules, such as solid state drives (SSDs), dual in-line memory modules (DIMMs), and small outline-DIMMs, all of which utilize memory cells to store data as an electrical charge or voltage. Improvements in storage density of these modules have been brought about by increasing the density of the memory cells on each individual memory component using enhanced manufacturing techniques. Additionally, the storage density of these modules has also been increased by including more memory components in each memory device or module using advanced board-level packaging techniques. However, as storage density has increased, so has the overall heat generated from the modules. Such heat generation is particularly problematic in blade server systems, where high-density SSDs and DIMMs are frequently accessed for memory read and write operations. In the absence of efficient heat dissipation mechanisms, this increased heat can ultimately lead to reduced performance or failure of either individual memory cells or the entire module.

To dissipate heat generated by tightly packed memory components, a memory module may make use of heat sinks that are coupled to the semiconductor memory devices or the module. Heat sinks may be mounted on top of the memory devices or the memory module. Airflow from fans may be routed through or past the heat sinks to help dissipate the heat. However, given the increasingly compact form factor of the memory modules, the combined heat dissipation effects of the heat sinks and the airflow is often insufficient. Thus, cooling systems normally have to be larger and/or operate their fans at higher speeds, which results in noisier less efficient, and costlier systems that do not sufficiently address the issue of non-uniform heat dissipation throughout each memory module. Therefore, it would be desirable to provide a cooling system that addresses the above mentioned problems.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various embodiments are used to dissipate heat generated by electronic components integrated in electronic modules of an electronic system (e.g., a memory system that includes closely spaced memory modules).

In one aspect, an electronic system includes a substrate that further includes a ground plane, at least one electronic component, and a heat sink mechanically coupled to an edge of the substrate. The at least one electronic component is mechanically coupled to the substrate and thermally coupled to the ground plane, such that heat generated by the at least one electronic component is dissipated at least partially to the ground plane of the substrate. The heat sink is thermally coupled to the ground plane to at least partially dissipate the heat generated by the at least one electronic component. In some embodiments, the heat sink further includes an attachment structure that is configured to mechanically couple to the edge of the substrate and thermally couple to the ground plane of the substrate; a tab that has a width substantially equal to a thickness of the substrate, wherein the tab is configured to extend from the attachment structure to mate with a slot in an assembly rack; and a plurality of heat dissipaters that are configured to increase the heat dissipation area of the heat sink.

Other embodiments and advantages may be apparent to those skilled in the art in light of the descriptions and drawings in this specification.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

FIG. 2A is an isometric view of an exemplary electronic assembly including an electronic system that includes heat sinks in accordance with some embodiments.

FIG. 2B illustrates a block diagram of an exemplary electronic assembly including an electronic system that includes one or more heat sinks in accordance with some embodiments.

FIG. 2C is a circuit diagram of an exemplary electrostatic discharge (ESD) protection circuit used in the electronic system in FIG. 2B in accordance with some embodiments.

FIG. 3A is an isometric view of another exemplary electronic system assembled on a rack of an electronic assembly in accordance with some embodiments.

FIG. 3B is an isometric view of the electronic system shown in FIG. 3A, which includes heat sinks at two opposite edges of its substrate in accordance with some embodiments.

FIG. 3C is an isometric view of an exemplary heat sink that is configured to couple to a substrate and dissipate heat generated thereon in accordance with some embodiments.

FIGS. 4A and 4B are two exploded isometric views of a substrate edge and a heat sink that are mechanically and thermally coupled to each other in accordance with some embodiments.

Figure 1:
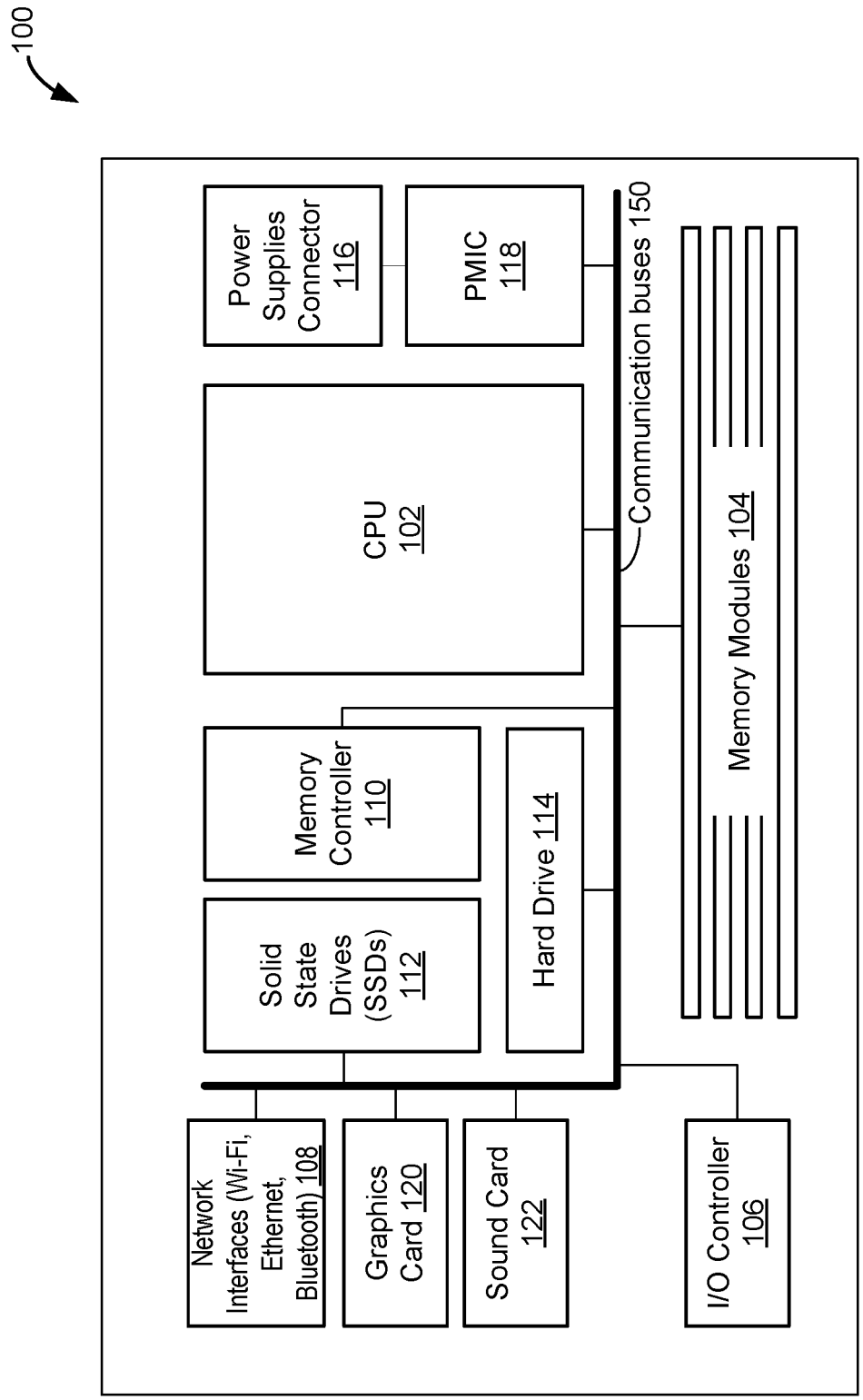
FIG. 1 is a block diagram of an exemplary system module in a typical computational device in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include systems, methods and/or devices used or integrated into electronic assemblies. In particular, the electronic systems, the heat sinks and the heat dissipation method described herein facilitate dissipation of heat generated by electronic components in the electronic systems.

One example of such an electronic system is a memory system that is commonly integrated in many computers and consumer electronic devices. The memory system oftentimes includes closely placed memory modules that require efficient heat dissipation. Some embodiments are described herein in the context of generic electronic systems. However, one of skill in the art will recognize that the embodiments described herein are used in a memory system and other electronic systems that include two or more electronic modules integrated in a limited space and which requires efficient dissipation of generated heat.

More specifically, according to some embodiments, an electronic system includes a substrate further including a ground plane, at least one electronic component, and a heat sink mechanically coupled to an edge of the substrate. The at least one electronic component is mechanically coupled to the substrate and thermally coupled to the ground plane of the substrate, such that heat generated by the at least one electronic component is dissipated at least partially to the ground plane of the substrate. The heat sink is thermally coupled to the ground plane of the substrate to at least partially dissipate the heat generated by the at least one electronic component.

In some embodiments, the heat sink further includes an attachment structure that is configured to mechanically couple to the edge of the substrate and thermally couple to the ground plane of the substrate; a tab that has a width substantially equal to a thickness of the substrate, wherein the tab is configured to extend from the attachment structure to mate with a slot in an assembly rack; and a plurality of heat dissipaters that are configured to increase the heat dissipation area of the heat sink. In some embodiments, the plurality of heat dissipaters includes a first set of fins that are substantially parallel to each other and a second set of fins that are substantially parallel to each other. The first set of fins and the second set of fins are oriented differently according to a direction of an airflow in order to distribute the airflow substantially evenly across the substrate. In some embodiments, at least one heat dissipater of the plurality of heat dissipaters extends from the heat sink where the edge of the substrate is attached to an area above a central region of the substrate, and overlaps with a part of the substrate.

In some embodiments, the heat sink further includes an attachment structure that is configured to allow the edge of the substrate to mechanically lock into the attachment structure.

In some embodiments, the heat sink includes a first sink that is mechanically coupled to a first edge of the substrate, and the electronic system further includes a second heat sink mechanically coupled via a second attachment structure to a second edge of the substrate that is opposite to the first edge of the substrate. The second heat sink is also thermally coupled to the ground plane to at least partially dissipate the heat generated by the at least one electronic component from the second edge of the substrate. Further, in some embodiments, each of the first heat sink and the second heat sink includes a respective tab that has a respective width substantially equal to a thickness of the substrate. The tabs of the first and second heat sinks are configured to extend from the respective attachment structure to mate with a card guide structure in an assembly rack at both edges of the substrate.

In some embodiments, the heat sink is electrically coupled to the ground plane via an electrostatic discharge (ESD) protection circuit.

In some embodiments, thermally conductive adhesive is applied to thermally couple and electrically insulate the heat sink and the substrate, and thermally conductive adhesive has substantially low thermal impedance and substantially high electrical resistance.

In some embodiments, the substrate includes a first substrate, and the electronic system includes a plurality of substrates including the first substrate. Each substrate in a subset of the plurality of substrates is thermally coupled to a respective heat sink at an edge of the respective substrate to dissipate heat generated by at least one respective electronic component mounted on the respective substrate, and each substrate of the subset of substrates is assembled on an assembly rack via a respective tab on the respective heat sink and oriented substantially in parallel.

According to another aspect of the invention, there is provided a heat sink for dissipating heat. The heat sink includes an attachment structure that is configured to mechanically couple to an edge of a substrate and thermally couple to a ground plane of the substrate, wherein the substrate includes the ground plane and at least one electronic component, and the at least one electronic component is mechanically coupled to the substrate and thermally coupled to the ground plane, such that heat generated by the at least one electronic component is at least partially dissipated to the ground plane of the substrate and further to the attachment structure of the heat sink.

The heat sink further includes a tab that has a width substantially equal to a thickness of the substrate, wherein the tab is configured to extend from the attachment structure to mate with a card guide structure in an assembly rack. The heat sink further includes a plurality of heat dissipaters that are configured to increase the heat dissipation area of the heat sink and at least partially dissipate the heat generated by the at least one electronic component.

In some embodiments, the attachment structure further includes a friction lock attachment slot configured to mechanically lock a substrate edge in accordance with a narrowed slot neck.

In some embodiments, the attachment structure further includes a first thermal via whose location matches that of a second thermal via on the corresponding substrate edge, and in accordance with integration of the heat sink and the substrate, the first and second thermal vias are aligned to form a heat pathway through the integrated heat sink and substrate.

Finally, according to another aspect of the invention, there is provided a heat dissipation method that includes providing an attachment structure and a tab of a heat sink according to geometries of an edge of a substrate, wherein the tab has a width substantially equal to a thickness of the substrate and is configured to extend from the attachment structure to mate with a card guide structure on an assembly rack. The method further includes providing a plurality of heat dissipaters on the heat sink, such that heat dissipation area of the heat sink is increased for at least partially dissipating heat absorbed by the heat sink. The heat sink is mechanically coupled at the edge of the substrate via the attachment structure to form an electronic system. The attachment structure is mechanically coupled to the edge of the substrate and thermally coupled to a ground plane of the substrate. At least one electronic component is mechanically coupled on the substrate and thermally coupled to a ground plane of the substrate. Heat generated by the at least one electronic component is dissipated at least partially to the ground plane of the substrate and further to the heat sink including the attachment structure, the tab and the plurality of heat dissipaters.

In some embodiments, the heat dissipation method further includes integrating the electronic system that includes the heat sink and the substrate onto an assembly rack of an electronic assembly.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the embodiments described herein.

FIG. 1 is a block diagram of an exemplary system module 100 in a typical computational device in accordance with some embodiments. The system module 100 in this computational device includes at least a central processing unit (CPU) 102, memory modules 104 for storing programs, instructions and data, an input/output (I/O) controller 106, one or more communication interfaces such as network interfaces 108, and one or more communication buses 150 for interconnecting these components. In some embodiments, the I/O controller 106 allows the CPU 102 to communicate with an I/O device (e.g., a keyboard, a mouse or a track-pad) via a universal serial bus interface. In some embodiments, the network interfaces 108 includes one or more interfaces for Wi-Fi, Ethernet and Bluetooth networks, each allowing the computational device to exchange data with an external source, e.g., a server or another computational device. In some embodiments, the communication buses 150 include circuitry (sometimes called a chipset) that interconnects and controls communications among various system components included in the system module.

In some embodiments, the memory modules 104 include high-speed random access memory, such as DRAM, SRAM, DDR RAM or other random access solid state memory devices. In some embodiments, the memory modules 104 include non-volatile memory, such as one or more magnetic disk storage devices, optical disk storage devices, flash memory devices, or other non-volatile solid state storage devices. In some embodiments, the memory modules 104, or alternatively the non-volatile memory device(s) within memory modules 104, include a non-transitory computer readable storage medium. In some embodiments, memory slots are reserved on the system module 100 for receiving the memory modules 104. Once inserted into the memory slots, the memory modules 104 are integrated into the system module 100.

In many embodiments, the system module 100 further includes one or more components selected from:
  a memory controller 110 that controls communication between the CPU 102 and memory components, including the memory modules 104, in the computational device;
  solid state drives (SSDs) 112 that apply integrated circuit assemblies to store data in the computational device, and in many embodiments, are based on NAND or NOR memory configurations;
  a hard drive 114 that is a conventional data storage device used for storing and retrieving digital information based on electromechanical magnetic disks;
  a power supply connector 116 that is electrically coupled to receive an external power supply;
  power management integrated circuit (PMIC) 118 that modulates the received external power supply to other desired DC voltage levels, e.g., 5V, 3.3V or 1.8V, as required by various components or circuits within the computational device;
  a graphics card 120 that generates a feed of output images to one or more display devices according to their desirable image/video formats; and
  a sound card 122 that facilitates the input and output of audio signals to and from the computational device under control of computer programs.

It is noted that the communication buses 150 also interconnect and controls communications among various system components including components 110-122.

Further, one skill in the art knows that other non-transitory computer readable storage media can be used, as new data storage technologies are developed for storing information in the non-transitory computer readable storage media in the memory modules 104 and in the SSDs 112. These new non-transitory computer readable storage media include, but are not limited to, those manufactured from biological materials, nanowires, carbon nanotubes and individual molecules, even though the respective data storage technologies are currently under development and yet to be commercialized.

Some of the aforementioned components generate heat during normal operation, and therefore, are integrated with separate heat sinks in order to reduce the temperatures of the corresponding components. For example, the solid state drives 112 used in a blade server may have heat sinks mounted on the top of each individual dual in-line memory module (DIMM) or on an electronic assembly containing the DIMMs. Heat generated from electronic components in the DIMMs are conducted primarily to the heat sinks, and further dissipated by airflow generated by fans. However, as the data workload in these blade servers increases and the form factor of the DIMMs decreases (e.g., closely placed memory slots in the memory modules 104), it becomes more difficult for conventional heat sinks and high-speed fans to conduct and dissipate the heat efficiently.

To address this issue, the various embodiments described herein include one or more heat sinks mechanically coupled to at least one edge, and in some embodiments, to two opposite edges of a substrate of an electronic system (such as the solid state drives 112 or the memory modules 104). These heat sinks are thermally coupled to the ground plane 210 of the substrate which is further thermally coupled to the heat generating components to provide an efficient heat dissipation channel to at least partially dissipate the heat generated by the electronic components mounted to the substrate. Moreover, in some embodiments, the heat sink and the substrate are configured to avoid design changes to a cabinet or enclosure that is used to hold the electronic system. Therefore, geometries of the heat sinks are configured to match both geometries of the corresponding edge(s) of the substrate and geometries of a corresponding assembly rack in the cabinet/enclosure as described below. By these means, the heat sinks can be conveniently assembled with the substrate of the electronic system and coupled to the existing cabinet/enclosure, thereby improving the efficiency for dissipating the heat generated in the electronic system.

FIG. 2A is an isometric view of an exemplary electronic assembly 200 including an electronic system 202 that includes heat sinks in accordance with some embodiments. In some embodiments, such an electronic assembly 200 contains the solid state drives 112 or the memory modules 104 that are used to store programs, instructions and/or data in a computational device as shown in FIG. 1. In some embodiments, the electronic assembly 200 is also used as any component other than the solid state drives 112 or the memory modules 104 in FIG. 1. In some embodiments, the electronic system 202 includes a plurality of substrates each having at least one electronic component mounted thereon, and each substrate is optionally associated with a DIMM.

The electronic assembly 200 includes an assembly rack 204 (sometimes called a cabinet rack or an enclosure rack) that is used to assemble the substrates of the electronic system 202. In the specific embodiment shown in FIG. 2, the assembly rack 204 includes a pair of rack parts 204A and 204B, and each rack part has a plurality of card guide slots. The two rack parts 204A and 204B face each other, and the card guide slots on the two rack parts are substantially aligned. In some embodiments, the assembly rack parts 204A and 204B are two separate parts, while in some embodiments, they are mechanically coupled together via a connector which is not shown in FIG. 2. Each substrate of the electronic system 202 is optionally configured to slide into the aligned card guide slots on the two rack parts 204A and 204B by itself or via one or more heat sinks coupled at its edge(s). When all substrates of the electronic system 202 are assembled on the assembly rack 20, they are arranged substantially in parallel with each other in the assembly rack 204, and together become a part of the electronic assembly 200.

In some embodiments, the plurality of substrates of the electronic system 202 fill some, but not all, of the card guide slots, and some slots are left open between the respective adjacent substrates. In some embodiments, the card guide slots are left open to accommodate additional heat sinks that are mounted on the top side or the bottom side of the adjacent substrates. Even without such additional heat sinks, the open card guide slots increase air volume and airflow that passes between the respective adjacent substrates of the electronic system 202, and therefore, improve the heat dissipation efficiency of the electronic assembly 200. However, under some circumstances, such heat dissipation improvement using the open card guide slots is not desired, because it compromises the device density of the electronic assembly 200.

Each substrate of the electronic system 202 includes two opposite edges that have a thickness configured to slide into the card guide slots on the rack parts 204A and 204B, respectively. In some embodiments, an electronic system 202 includes a first heat sink that is mechanically coupled to one of the two opposite edges, and is configured to slide into the corresponding card guide slot. When the electronic system 202 is assembled on the assembly rack 204, the first heat sink is coupled between the substrate of the electronic system 202 and the assembly rack 204.

In some embodiments, the same electronic system 202 further includes a second heat sink that is mechanically coupled to the opposite edge of substrate. Here, when the electronic system 202 is assembled on the assembly rack 204, each of the first heat sink and the second heat sink is coupled between the electronic system 202 and a respective slot of the assembly rack 204, i.e., at the opposite edges of the respective substrate of the electronic system 202.

Each substrate of the electronic system 202 that is assembled with the assembly rack 204 is optionally integrated with one heat sink, two heat sinks, or no heat sink at their respective edges according to its own heat dissipation requirement. When a substrate of the electronic system 202 is directly assembled on the assembly rack 204 without including a heat sink at its edges, both of the two opposite edges of the respective substrate have geometries that match those of the corresponding card guide slots on the assembly rack 204, and the substrate length matches the separation d between the corresponding card guide slots on the assembly rack 204. When a substrate of the electronic system 202 is coupled with heat sink(s) at one or both of its two opposite edges, the substrate length of the electronic system 202 has to be shortened at the corresponding edge(s) to accommodate the heat sink(s). The geometries of the heat sink(s) match both the geometries of the edge of the substrate and the geometries of the card guide slots. Here, the total length of the substrate with the one or more heat sinks is equal to the separation d between the corresponding slots on the assembly rack. More details on how to configure the geometries of the heat sinks are explained in detail below with reference to FIGS. 3A-3C.

In some embodiments, a heat sink coupled to an edge of a substrate of the electronic system 202 is not a single component, but instead includes two or more heat sink components.

FIG. 2B illustrates a block diagram of an exemplary electronic assembly 200 including an electronic system 202 that includes one or more heat sinks 214 in accordance with some embodiments. As explained above, the electronic assembly 200 includes an assembly rack 204 (sometimes called a cabinet or enclosure rack) that is configured to receive one or more substrates 206 of the electronic system 202. In particular, the assembly rack 204 includes a plurality of card guide structures 208 (e.g., the card guide slots shown in FIG. 2A) that are used to align and retain in place the electronic system 202 in the electronic assembly 200.

Each substrate 206 of the electronic system 202 includes two opposite edges configured to couple to the card guide structures 208. In some embodiments, the substrate 206 is made of a printed circuit board (PCB), and includes a plurality of power planes (e.g., a ground plane 210) and a plurality of signal planes.

The electronic system 202 further includes at least one electronic component 212 that is mounted on each substrate 206. The electronic component 212 generates heat which is at least partially dissipated to the substrate 206. Under some circumstances, the generated heat is not efficiently dissipated out of the electronic assembly 200, and causes temperature increases in the power planes and the signal planes in the substrate 206.

In some embodiments, as explained above with reference to FIG. 2A, the electronic assembly 200 further includes one or more electronic components 212 thermally coupled to a ground plane 210. A heat sink 214 is also thermally coupled to the ground plane 210 of the substrate 206 to at least partially dissipate the heat that is generated by the at least one electronic component 212. In some embodiments, the heat sink 214 further includes an attachment structure 216, a card guide tab 218 and a plurality of heat dissipaters 220. The attachment structure 216 is configured to mechanically couple to the edge of the substrate 206 and thermally couple to the ground plane 210 of the substrate 206. The card guide tab 218 is configured to extend from the attachment structure 216 to mate with the corresponding card guide structure 208 on the assembly rack 204. In some embodiments, the card guide tab is thermally coupled to both the attachment structure 216 and the card guide structure 208. The plurality of heat dissipaters 220 are coupled on the attachment structure 216 and/or the card guide tab 218. The heat dissipaters 220 are configured to increase the heat dissipation area of the heat sink, and at least partially dissipate the heat generated by the electronic component 212.

In some embodiments, as a result of using the heat sinks 214, a heat dissipation path 222 is formed to dissipate the heat generated by the electronic component 212 mounted on the substrate 206 of the corresponding electronic system 202. Along the heat dissipation path 222, at least a part of the generated heat is transferred to the ground plane 210 of the substrate 206, further to the heat sink 214, and thereafter efficiently dissipated via the heat dissipaters 220 of the heat sink 214. It is also noted that in some embodiments, the heat absorbed by the heat sinks 214 is also at least partially transferred to the card guide structure 208 of the assembly rack 204 for heat dissipation.

In some embodiments, an electronic system 202 further includes an electrostatic discharge (ESD) protection circuit 224. The ESD protection circuit 224 is mechanically mounted on the substrate 206 of the electronic system 202, and configured to electrically couple the heat sink 214 to the ground plane 210 of the substrate 206. The ESD protection circuit 224 provides the heat sink 214 with an electrical pathway to the ground of the electronic system 202 for the purposes of discharging electrostatic charge built-up on the heat sink 214 which may otherwise damage the electronic component 212. In some situations, electrostatic charge is generated on the heat sink 214 when it is attached to the substrate edge or inserted to the card guide structure 208, and may also be generated by airflow passing over the surface of the heat sink 214.

One skill in the art knows that the ESD protection circuit 224 is optionally used to electrically couple the heat sink 214 and the ground plane 210 of the substrate 206. In some embodiments, a thermal connector (e.g., thermally conductive adhesive) is used to thermally couple the heat sink 214 and the ground plane 210. The thermal connector has no or substantially low electrical conductivity, and therefore, the heat sink 214 and the ground plane 210 are substantially insulated from each other. To discharge electrostatic charge built-up on the heat sink 214, an electrical path may be optionally created between the heat sink 214 and a certain ground (e.g., an assembly ground of the electronic assembly 200).

FIG. 2C is a circuit diagram of an exemplary ESD protection circuit 224 used in the electronic system 202 shown in FIG. 2B in accordance with some embodiments. The ESD protection circuit 224 includes a resistor R and a capacitor C that are coupled in parallel between the ground plane 210 of the substrate 206 and the heat sink 214. In a specific embodiment, a resistor R has electrical resistance of 1 Mohm, thereby resulting in a weak electrical path to drain the electrostatic charge to the ground of the substrate 206. While a resistor R having substantially small resistance may electrically couple the heat sink 214 to the ground of the substrate 206 in a better way, such electrical coupling may result in ground loops which add noise and are detrimental to performance of the electrical components 212 in the electrical system 202. Optionally, the resistor R and the capacitor C are discrete electrical components mounted on the substrate 206 of the electrical system 202. However, in some embodiments, the resistor R and the capacitor C are integrated into an electronic component 212 that is specifically provided as an ESD protection component. In some embodiments, the resistor R and the capacitor C are included in an electronic component 212 that is used primarily for another function in addition to discharging the electrostatic charges on the heat sink 214.

In some embodiments, the electronic assembly 200 discharges the electrostatic charges that have built up on the heat sink 214 or the electronic system 202 to a global ground of the electronic assembly 200 via the card guide structure 208 of the assembly rack 204. In these embodiments, the ESD protection circuit 224 is not coupled between the substrate 206 of the electronic system 202 and the heat sink 214. Therefore, the ESD protection circuit 224 is optionally included in the electronic system 202 in accordance with specific assembly level considerations to reduce electrical noise and avoid current loops in a ground system of the electrical assembly 200.

In general, the heat sink 214 is made out of a material that has a higher heat capacity than the substrate 206 of the electronic system 202, and, therefore, acts as a heat reservoir to absorb and dissipate heat generated by the electronic components 212 in the electronic system 202. Furthermore, the heat sink 214 is preferably coupled to a ground via an electrical pathway, to effectively eliminate electrostatic charge accumulated on the heat sink 214.

FIG. 3A is an isometric view of another exemplary electronic system 202 assembled on a rack 204 of an electronic assembly 200 in accordance with some embodiments. In this specific embodiment, only one substrate 206 is shown in the electronic system 202 and assembled on the assembly rack 204 of the electronic assembly 200. FIG. 3B is an isometric view of the electronic system 202, shown in FIG. 3B, which includes heat sinks 214 at two opposite edges of its substrate 206 in accordance with some embodiments. FIG. 3C is an isometric view of an exemplary heat sink 214 that is configured to couple to a substrate 206 and dissipate heat generated thereon in accordance with some embodiments. In the specific embodiment shown in FIG. 3B, the heat sinks 214 are assembled on the edges of the substrate 206 to form an electronic system 202 for further coupling to the assembly rack 204 in the electronic assembly 200 as shown in FIG. 3A. In some embodiments not illustrated in the figures, the heat sinks 214 are optionally assembled to the assembly rack 204, before the substrate 206 of the electronic system 202 is subsequently coupled to the heat sinks 214.

The assembly rack 204 includes two opposite rack parts 204A and 204B that have a fixed separation d. The rack parts 204A and 204B further include card guide structures 208 on their respective inner sides, and the card guide structures 208 are configured to receive the substrate 206 of the electronic system 202. As explained above with reference to FIG. 2A, in some embodiments, a plurality of card guide structures 208 are included on the rack parts 204A and 204B for assembling a plurality of substrates 206 of the electronic system 202 in a substantially parallel configuration.

In some embodiments, two adjacent card guide structures 208 on the rack part 204A or 204B are separated by a vent opening 302. Airflow generated by an external fan enters or exits a space between two corresponding adjacent substrates 206 via the vent opening 302, such that the heat generated and accumulated on the two adjacent substrates 206 are efficiently carried away by the airflow. In some embodiments, when a heat sink 214 is coupled between the assembly rack 204 and the substrate 206 of the electronic system 202, the airflow flows over the heat sink 214 and particularly the heat dissipaters 220 on the heat sink 214 to dissipate the heat absorbed thereby.

Optionally, two opposite edges of the substrate 206 of the electronic system 202 are directly coupled to the card guide structures 208 on the assembly rack 204. In these embodiments, the length of the substrate 206 matches the separation d between the rack parts 204A and 204B. Optionally, at least one of the two opposite edge the substrate 206 of the electronic system 202 is indirectly coupled to the card guide structures 208 using a respective heat sink 214. The length of the substrate 206 is reduced to accommodate the heat sink 214, such that the total length of the substrate 206 and the one or more heat sinks 214 still matches the separation d between the rack parts 204A and 204B.

In some embodiments, the electronic system 202 is a memory module that includes memory integrated circuits components mounted on a printed circuit board (PCB) substrate. Embodiments of the memory module include, but are not limit to, single in-line memory modules (SIMMs) and dual in-line memory modules (DIMMs). Each memory module further includes a series of random-access memory integrated circuits. Surface-mount or through-hole technologies are used to electrically couple these memory integrated circuits to signal paths and power rails that are implemented on the plurality of signal planes and power planes included in the PCB substrate. The signal paths and power rails are routed to optionally couple the memory integrated circuits to each other, to other electronic components on the PCB substrate or to electrical pads arranged on substrate edges for external connection. In some embodiments, at least some of the signal paths and power rails are routed to a third edge of the substrate 202 that is distinct from the two opposite edges coupled to the assembly rack 204, and terminate at a corresponding set of electrical pads on the third edge of the substrate 202. In some embodiments, the number of electrical pads ranges from 72 to 244 for some commonly used DIMMs.

In some embodiments, an electronic connector 304 is further coupled in the space between the rack parts 204A and 204B. The electronic connector 304 is configured to electrically couple to the set of electrical pads on the third edge of the substrate 202 when the electronic system 202 is assembled on the assembly rack 204. When the assembly rack 204 is further integrated in a system module 100, the electronic connector 304 is mechanically and electrically coupled to a system board (e.g., a mother board of a computer), and enables communication between the electronic system 202 and other modules in the system module 100. In particular, the other modules in the system module 100 may access the memory modules to store and retrieve information therein.

As shown in FIG. 3C, the heat sink 214 includes an attachment structure 216, a card guide tab 218 and heat dissipaters 220, and particularly, the attachment structure 216 is configured to match the width or the thickness of the corresponding edge of the substrate 206 of the electronic system 202. In this specific embodiment, the attachment structure 216 is an opening channel where the heat sink 214 receives the edge of the corresponding substrate 206, and thermally couples to the ground plane 210 of the substrate 206. In some situations, the attachment structure 216 physically contacts the ground plane 210. However, in some situations, a layer of thermally conductive adhesive is applied on the attachment structure 216 to couple the heat sink 214 and the substrate 206, and thus, the heat sink 214 may not be directly in contact with the substrate 206 or the ground plane 210 therein.

Further as shown in FIG. 3C, the card guide tab 218 includes a card guide extrusion that has a tab width substantially equal to the thickness of the substrate 206, and thereby, the card guide tab 218 may fit into the card guide structure 208 on the assembly rack 204, which is originally configured to match the edges of the substrate 206. In some embodiments, the card guide tab 218 has an extended tab length, and the substrate has to be shortened to accommodate the heat sink 218 between itself and the assembly rack 204. In some embodiments, two heat sinks 214 are coupled to the two opposite edges of the substrate 206. The card guide tabs 218 of both heat sinks 214 are configured to extend from the corresponding attachment structures 216 of the heat sinks 214 to mate with the card guide structures 208 on the assembly rack 204.

In various embodiments of the invention, the heat sink 214 is mechanically coupled to the substrate 206 of the electronic system 202 and the card guide structures of the assembly rack 204. In some embodiments that require a compression fit, some amount of force is required to push the heat sink 214 onto the corresponding substrate edge, and/or further assemble the assembled electronic system 202 into the card guide structures 208 of the assembly rack 204. The heat sink 214 as shown in FIG. 3C is one exemplary heat sink that uses a compression fit to couple to the corresponding substrate edge. In some embodiments, solder fingers/tabs and solder footprint pads are provided on the attachment structure 216 of the heat sink 214 and an edge area of the corresponding substrate 216, respectively. The heat sink 214 and the substrate 206 are mechanically coupled together by solder bonding the solder fingers/tabs and footprint pads. Further in some embodiments, screws, tabs and/or glue are used to attach the heat sink 214 to the substrate 206, and potentially facilitate replacement of either the heat sink 214 or the substrate 206.

FIGS. 4A and 4B are two exploded isometric views 400 and 450 of a substrate edge and a heat sink that are mechanically and thermally coupled to each other in accordance with some embodiments. These two exploded isometric views 400 and 450 are captured from two sides of the corresponding substrate 206. It is noted that in various embodiments of the invention, a substrate edge includes, but is not limited to, a substantially narrow side wall of the substrate edge. Rather, the substrate edge 402 also refers to an edge area (e.g., substrate edges 402A and 402B as observed on the two opposite sides of the substrate 206) close to and/or surrounding the narrow side wall of the substrate edge 402.

In some embodiments, the substrate edge 402 includes one or more thermal vias 406, and similarly, an attachment structure 216 of the heat sink 214 also includes one or more thermal vias 408 on corresponding locations. Upon integration of the heat sink 214 and the substrate 206, a thermal via 406 on the substrate edge 402 and corresponding one or two thermal vias 408 on the attachment structure 216 of the heat sink 214 are aligned and form a heat pathway through the assembled heat sink 214 and substrate 206. When airflow passes through the heat pathway 222, a part of the heat absorbed by the heat sink 214 may be efficiently carried away by the airflow. In some embodiments, the locations of the thermal vias 406 are arranged between two respective dissipaters 220 that are coupled to the attachment structure 216. Although two heat pathways are formed via two sets of thermal vias in this specific embodiment shown in FIGS. 4A and 4B, one of those skilled in the art knows that more than two heat pathways could be formed on the substrate edge 402 when their locations are well selected to avoid the heat dissipaters 220.

In some embodiments, the area of the substrate edge 402 extends further back into the central area of the substrate 206 to accommodate more thermal vias in addition to the thermal vias 406 on an outmost edge of the substrate 206. The attachment structures 216 are optionally extended to overlap more with the substrate edge 402, and therefore, accommodate more thermal vias for forming more heat pathways together with the corresponding additional thermal vias on the substrate edge 402. In accordance with such arrangements, the heat dissipation efficiency is increased not only because of a larger overlapping area between the substrate 206 and the heat sink 214, but also because of the increased number of heat pathways. However, in some embodiments, only the area of the substrate edge 402 extends further back into the central area of the substrate 206 to accommodate more thermal vias, and the airflow passes through these additional thermal vias to directly dissipate heat from the substrate 206.

In some embodiments, sidewalls of the thermal vias 406 and additional thermal vias on the substrate 206 are electrically insulated from any signal or ground plane 210 in the substrate 206. Sidewalls of the heat pathways formed based on the thermal vias are also electrically insulated from the signal or ground plane 210 in the substrate 206. In other words, the signal traces or the ground plane 210 in the substrate 206 are not exposed on the sidewalls of the thermal vias 206 on the substrate 206 or the corresponding heat pathways, such that no direct electrical path is formed from the heat sink 214 and the ground plane 210 in the substrate 206. Under some circumstances, the thermal vias 406 on the substrate 206 have a substantially small relief area (or a substantially small dimension), and edges of the signal traces in the signal planes or the ground plane 210 are physically in proximity, but not exposed, to the sidewalls of the thermal vias 406 on the substrate 206. Rather, in some embodiments, the ESD protection circuit 224 is electrically coupled between the heat sink 214 and the ground plane 210 of the substrate 206 to provide an alternative electrical path to discharge the electrostatic charges accumulated on the heat sink 208.

In some embodiments, similar vias are drilled on the substrate edge 402 and/or the attachment structure 216 on the heat sink 214. Fasteners (e.g., screws or nuts/bolts) are inserted into these vias and tightened to mechanically couple the substrate 206 and the heat sink 214 together. In some embodiments, the substrate edge 402A and/or the attachment structure 216 further include a respective tab that optionally includes vias, and the respective tab also facilitates fastening the substrate 206 and the heat sink 214 together using certain fasteners.

In some embodiments, a layer of thermally conductive adhesive is applied to coat the substrate edge 402 and/or the attachment structure 216. As such, the substrate 206 and the heat sink 214 are not in direct contact but remain coupled to each other via the layer of thermally conductive adhesive. This layer of thermally conductive adhesive has substantially low thermal impedance and substantially high electrical resistance to thermally couple the heat sink 214 to the ground plane 210 in the substrate 206 while electrically insulating them. In some embodiments, the heat sink 214 is electrically coupled to an ESD protection circuit 224 which provides an alternative electrical path to discharge the electrostatic charges on the heat sink 214 to the ground plane 210 of the substrate 206. More details on the ESD protection circuit 224 are discussed above with reference to FIGS. 2B and 2C.

Figure 5C:
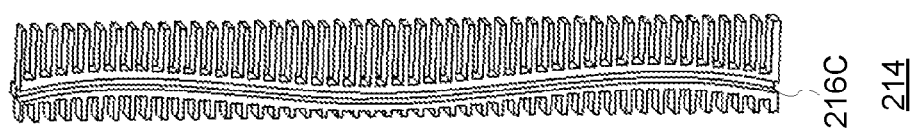
FIGS. 5A-5C are three-dimensional views of three exemplary heat sinks including a respective attachment structure that is configured to mechanically couple to an edge of a substrate in accordance with some embodiments.
Figure 5B:
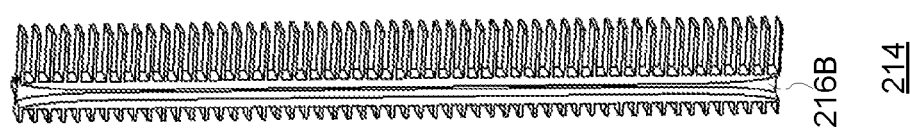
Figure 5A:
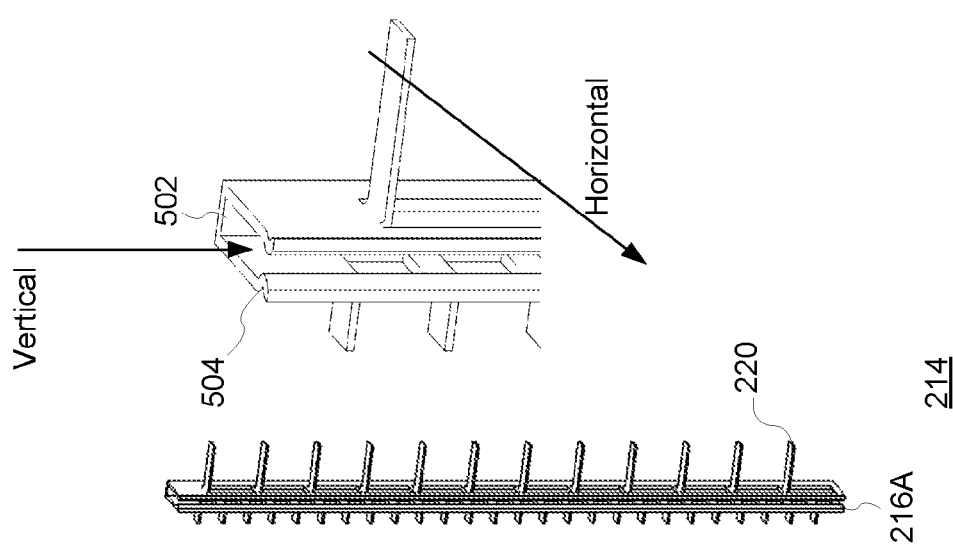

FIGS. 5A-5C are three-dimensional views of three exemplary heat sinks 214 including a respective attachment structure 216A, 216B or 216C that is configured to mechanically couple to an edge of a substrate 206 in accordance with some embodiments. Each attachment structure 216A, 216B or 216C includes a friction lock attachment slot 502 into which a corresponding substrate edge is inserted and locked. In particular, the attachment structure 216A has a narrowed slot neck 504 at the edge of the friction lock attachment slot 502, and the inserted substrate edge has to include grooves at corresponding locations to match the narrowed slot neck 504. When the substrate 206 is inserted into the friction lock attachment slot 502 along a vertical direction, it cannot be freely detached along other directions, such as a horizontal direction, because the narrowed slot neck 504 substantially locks the substrate 206 in position.

In the specific embodiment shown in FIG. 5A, the attachment structure 216A is left open between every two heat dissipaters 220 that are mechanically coupled to two opposite sides of the attachment structure 216A. In addition to an open side to receive the substrate 206 and these two sides to couple to the heat dissipaters 220, the attachment structure 216A further includes a far side that maintains a good contact with the edge of the substrate 206 when the substrate 206 is locked in position.

Optionally, the friction lock attachment slot 502 of the attachment structure (e.g., structure 216B) has a widened slot end to facilitate insertion of the substrate 206 into the friction lock attachment slot 502. Optionally, the friction lock attachment slot 502 of the attachment structure (e.g., structure 216C) has a slightly curved shape, and the corresponding substrate edge adopts a shape that matches the curved shape of the slot 502.

In some embodiments, a layer of adhesive material is applied at the interface of the attachment structure 216A-216C and the corresponding substrate edge. When the substrate 206 is placed in position and the layer of adhesive material is healed by a certain treatment (e.g., by a thermal process), the heat sink 214 and the substrate 206 are glued together. However, in some embodiments, an alternative mechanical locking mechanism (e.g., the narrowed slot neck 504) is applied in place of the adhesive material and provides the needed mechanical stability. Under some circumstances, when the heat sink 214 or the substrate 206 does not function properly and has to be replaced, the alternative locking mechanism allows the non-functioning part to be detached and replaced easily while keeping the other functioning part.

Figure 6B:
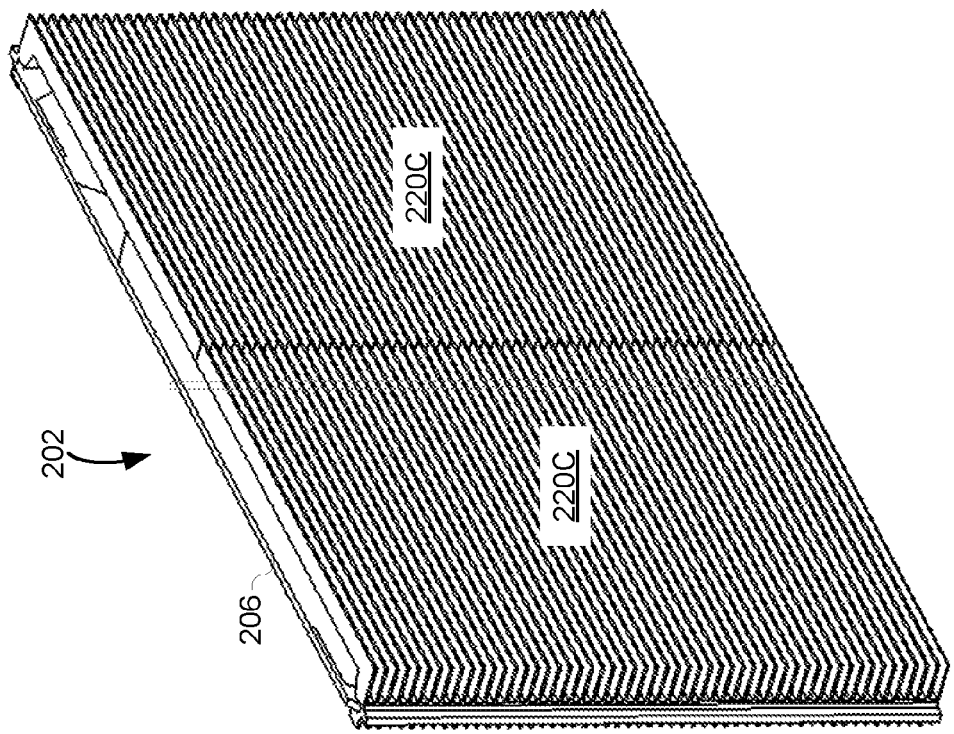
FIGS. 6A and 6B are isometric views of two exemplary heat sinks each having a plurality of heat dissipaters configured to increase the heat dissipation area of the respective heat sink in accordance with some embodiments
Figure 6A:
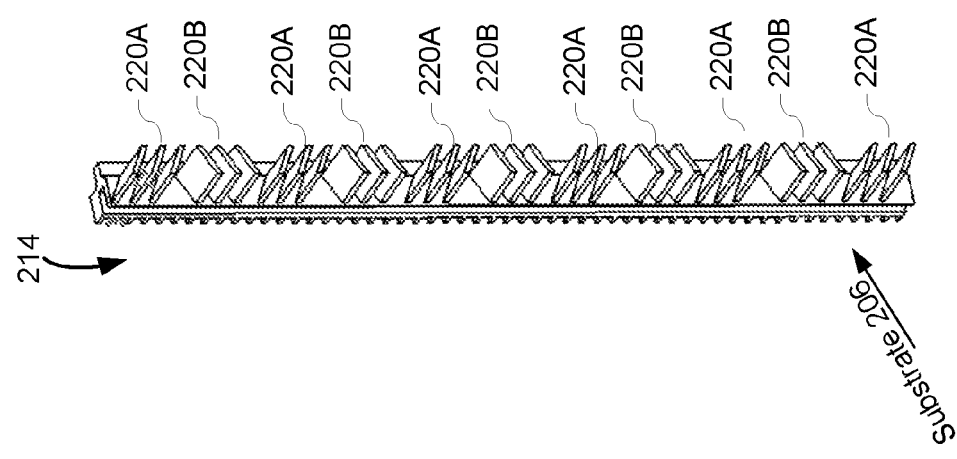

FIGS. 6A and 6B are isometric views of two exemplary heat sinks 214 each having a plurality of heat dissipaters 220 configured to increase the heat dissipation area of the respective heat sink 214 in accordance with some embodiments. The plurality of heat dissipaters 220 are attached to the attachment structure 216 and/or the card guide tab 218 of the heat sink 214. In these two specific embodiments, the heat dissipaters 220 include a plurality of fins that effectively act as heat radiators and control airflow. In some embodiments as shown in FIG. 6A, the plurality of heat dissipaters includes a first set of fins 220A that are substantially parallel to each other and a second set of fins 220B that are also substantially parallel to each other. The first set of fins 220A and the second set of fins 220B are oriented differently (e.g., with a 60°/120° angle) according to a direction of incoming airflow. Further, in some embodiments, the fin orientation for the heat sink 214 depends on whether the heat sink 214 is located on an air inlet side or an air outlet side of the electronic assembly 200. As such, the airflow is disturbed to create airflow vortexes, and distributed substantially evenly across the substrate 206 that is thermally coupled to the heat sink 214.

In some embodiments, at least one heat dissipater of the plurality of heat dissipaters extends from the heat sink 214 to which the edge of the substrate is attached to an area above a central region of the substrate 206, and substantially overlaps with a part of the substrate. Optionally, the at least one heat dissipater is not in contact with the substrate 206. Optionally, the at least one heat dissipater comes in contact with an electronic component that is mounted on the substrate 206, and directly absorbs and dissipates the heat generated by the electronic component.

In some embodiments, the plurality of heat dissipaters include a plurality of fins 220 that are substantially parallel, and the plurality of fins 220C extend to a central region of the substrate 206 on one side of the substrate 206. In the specific embodiment shown in FIG. 6B, the substrate 206 is thermally coupled to two heat sinks 214 at two opposite substrate edges, and each heat sink 214 includes a plurality of heat dissipaters that are extended to the central region of the substrate 206 on one side of the substrate 206. When the heat dissipaters 220 of the two heat sinks 214 meet around the central region of the substrate 206, the corresponding side of the substrate 206 is substantially covered by the heat sink 214. In some embodiments not shown here, on both sides of the substrate 206, the heat dissipaters 220C of the respective heat sink 214 at the two opposite substrate edges are extended to the central region of the substrate 206. When the heat dissipaters 220 of the two heat sinks 214 meet around the central region of the substrate 206, the substrate 206 is substantially enclosed by the heat dissipaters of the heat sink 214.

Such extended dissipaters increase the corresponding heat dissipation area of the heat sinks 214 and improve the heat transfer efficient, when airflow is applied to dissipate heat generated in the electronic system 202. In one specific embodiment, the substrate 206 is made of a commonly used PCB, and the corresponding electronic system 202 consumes an electrical power of 12 W. When airflow of 200 linear feet per minute is used, the extended dissipaters 220 reduce the temperature of the substrate 206 approximately by 6° C.

In various embodiments of the invention, a wide range of fin geometries are available when different fabrication processes (e.g., die casting, injection molding, forging and stamping) are used to manufacture the heat sinks 214. Such heat sinks can be used with a range of different substrates that could have different thermal dissipation requirements. In some embodiments, the extended dissipaters of the heat sinks 214 are designed to create local turbulent airflows around key areas of the electronic system.

Figure 7:
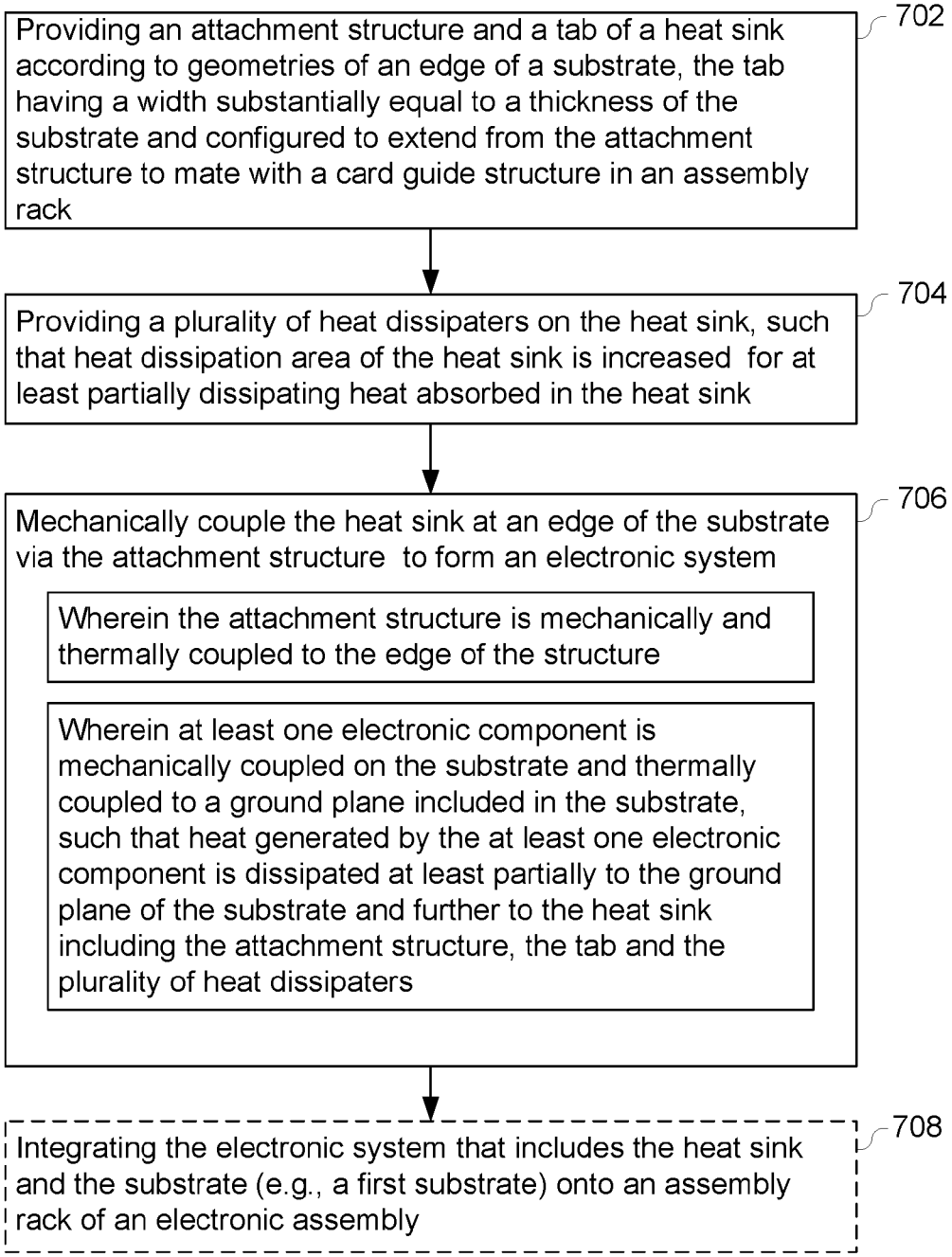
FIG. 7 illustrates an exemplary flow chart of a method for assembling an electronic system including one or more heat sinks configured to dissipate heat generated in the electronic system in accordance with some embodiments.

FIG. 7 illustrates an exemplary flow chart of a method 700 for assembling an electronic system 202 including heat sink(s) 214 configured to dissipate heat generated in the electronic system in accordance with some embodiments. An attachment structure (e.g., the attachment structure 216) and a tab (e.g., the card guide tab 218) of a heat sink are provided (702) according to geometries of an edge of a substrate, and the tab has a width substantially equal to a thickness of the substrate and is configured to extend from the attachment structure to mate with a card guide structure on an assembly rack. In some embodiments, the card guide structure includes a card guide slot that receives the substrate edge (when the heat sink is not coupled thereto) or the tab of the heat sink (when the heat sink is coupled to the substrate edge).

In some embodiments, the attachment structure includes a friction lock attachment slot that is configured to match the geometries of the substrate edge, such that the substrate edge may be inserted and locked into the friction lock attachment slot. Optionally, the friction lock attachment slot has a locking mechanism (e.g., a narrowed slot neck) to mechanically interlock the heat sink and the substrate edge. Optionally, thermally conductive adhesive is used to glue the heat sink and the substrate edge together. In some embodiments, vias are drilled on the substrate edge and the attachment structure to allow fasteners to mechanically tighten them together. Under some circumstances, thermal vias are drilled on both the attachment structure and the substrate edge to create a heat pathway through the heat sink assembled at the substrate edge. More details and embodiments for the attachment structure are discussed above with reference to FIGS. 4A, 4B, and 5A-5C.

A plurality of heat dissipaters (e.g., the heat dissipaters 220) are further provided (704) on the heat sink, such that heat dissipation area of the heat sink is increased for at least partially dissipating heat absorbed by the heat sink. More details and embodiments for the heat dissipaters are discussed above with reference to FIGS. 6A and 6B.

The heat sink is mechanically coupled (706) at the edge of the substrate via the attachment structure to form an electronic system, wherein the attachment structure is mechanically coupled to the edge of the substrate and thermally coupled to a ground plane of the substrate, and wherein at least one electronic component is mechanically coupled on the substrate and thermally coupled to a ground plane 210 of the substrate, and heat generated by the at least one electronic component is dissipated at least partially to the ground plane of the substrate and further to the heat sink including the attachment structure, the tab and the plurality of heat dissipaters. More details on integrating the heat sink and the substrate are discussed above with reference to FIGS. 2A, 2B, and 3A-3C.

Further, the electronic system that includes the heat sink and the substrate (e.g., a first substrate) are integrated (708) onto an assembly rack of an electronic assembly. In some embodiments, the electronic system further includes at least one more substrate (e.g., a second substrate) that is optionally coupled to a corresponding heat sink, and the first and second substrates are arranged substantially in parallel with each other in accordance with the assembly rack of the electronic assembly. More details on integrating the electronic system in the electronic assembly are discussed above with reference to FIGS. 2A, 2B, and 3A.

In accordance with various embodiments of the invention, application of heat sinks effectively reduces thermal resistance of a substrate (e.g., a regular PCB) by forcing heat convection between the substrate and the heat sinks and by increasing an effective surface area of the ground plane exposed to directed airflow. In many embodiments, the lowest thermal conductivity denominator in an electronic system is associated with an in-plane thermal resistance of the substrate of the electronic system. Thus, a heat sink is a suitable choice to improve the heat dissipation efficiency of the electronic system, when it has a thermal conductivity larger than or comparable to the corresponding in-plane thermal conductivity of the substrate.

Additionally, the heat sinks act as extended protection edges, when they are mechanically coupled to substrate edges. For instance, a heat sink may lift up the substrate of the electronic system above a surface and avoids electronic components mounted thereon from directly landing on the surface and being potentially damaged. Further, the heat sinks (rather than the substrate edges) are repeatedly inserted and detached from a card guide structure on an assembly rack, and electrostatic charges are generated on the heat sinks rather than on the substrate. Thus, the substrate edges of the electronic system are protected from mechanical damages due to misuse or repeated insertions, and more importantly, the electronic components are better protected from electrostatic discharges when the charges are not accumulated on the substrate to which the electronic components are directly coupled. In particular, in some embodiments, a managed ESD discharge path may be provided through the card guide structures without passing the substrate and further reduce the impact on the electronic components on the substrate.

In some embodiments, the heat sinks are coupled to the substrate edges rather than to individual electronic components. Such a heat sink does not need to remain in direct contact with multiple electronic components as required in many existing electronic systems. Thus, mismatch of thermal coefficients is allowed between the heat sink and the corresponding electronic components.

As noted above, in some embodiments, the electronic system 202 includes one or more memory modules in a computational device, and in some embodiments, the electronic component 212 of the electronic system 202 includes semiconductor memory devices or elements. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive elements, active elements, or both. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements included in a single device, such as memory elements located within and/or over the same substrate or in a single die, may be distributed in a two- or three-dimensional manner (such as a two dimensional (2D) memory array structure or a three dimensional (3D) memory array structure).

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer on which the material layers of the memory elements are deposited and/or in which memory elements are formed or it may be a carrier substrate which is attached to the memory elements after they are formed.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, including a bit line and a word line.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked planes of memory devices. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single plane, sometimes called a horizontal (e.g., x-z) plane for ease of discussion. Alternatively, the memory elements may be connected together to extend through multiple parallel planes. Other three dimensional configurations can be envisioned wherein some NAND strings contain memory elements in a single plane of memory elements (sometimes called a memory level) while other strings contain memory elements which extend through multiple parallel planes (sometimes called parallel memory levels). Three dimensional memory arrays may also be designed in a NOR configuration and in a ReRAM configuration.

A monolithic three dimensional memory array is one in which multiple planes of memory elements (also called multiple memory levels) are formed above and/or within a single substrate, such as a semiconductor wafer, according to a sequence of manufacturing operations. In a monolithic 3D memory array, the material layers forming a respective memory level, such as the topmost memory level, are located on top of the material layers forming an underlying memory level, but on the same single substrate. In some implementations, adjacent memory levels of a monolithic 3D memory array optionally share at least one material layer, while in other implementations adjacent memory levels have intervening material layers separating them.

In contrast, two dimensional memory arrays may be formed separately and then integrated together to form a non-monolithic 3D memory device in a hybrid manner. For example, stacked memories have been constructed by forming 2D memory levels on separate substrates and integrating the formed 2D memory levels atop each other. The substrate of each 2D memory level may be thinned or removed prior to integrating it into a 3D memory device. As the individual memory levels are formed on separate substrates, the resulting 3D memory arrays are not monolithic three dimensional memory arrays.

Further, more than one memory array selected from 2D memory arrays and 3D memory arrays (monolithic or hybrid) may be formed separately and then packaged together to form a stacked-chip memory device. A stacked-chip memory device includes multiple planes or layers of memory devices, sometimes called memory levels.

The term "three-dimensional memory device" (or 3D memory device) is herein defined to mean a memory device having multiple layers or multiple levels (e.g., sometimes called multiple memory levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

A person skilled in the art will recognize that the invention or inventions descried and claimed herein are not limited to the two dimensional and three dimensional exemplary structures described here, and instead cover all relevant memory structures suitable for implementing the invention or inventions as described herein and as understood by one skilled in the art.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A heat sink for dissipating heat, comprising:
an attachment structure defining a slot configured to receive an edge of a substrate and thermally couple to a ground plane of the substrate; and
a tab located opposite to the slot, the tab being configured to slide into a card guide slot of an assembly rack, such that in use, heat generated by at least one electronic component on the substrate is at least partially transferred through the ground plane to the attachment structure to be dissipated.

2. The heat sink of claim 1, wherein the tab has a width substantially equal to a thickness of the substrate, and the tab extends from the attachment structure, thereby being configured to mate with the card guide slot.

3. The heat sink of claim 1, wherein at one or both ends along a length of the slot, the attachment structure has a widened slot end configured to facilitate insertion of the substrate into the slot.

4. The heat sink of claim 1, wherein the slot is curved along its length.

5. The heat sink of claim 1, wherein the slot includes a friction lock configured to mechanically grip the edge of the substrate.

6. The heat sink of claim 5, wherein the friction lock comprises a narrowed slot neck.

7. The heat sink of claim 1, wherein the attachment structure further comprises a first thermal via configured to align and thermally contact with a second thermal via at the edge of the substrate.

8. The heat sink of claim 1, further comprising:
a plurality of heat dissipaters coupled to the attachment structure, where the heat dissipaters are configured to increase the heat dissipation area of the heat sink and at least partially dissipate heat generated by the at least one electronic component.

9. The heat sink of claim 8, wherein the plurality of heat dissipaters comprises a first set of fins that are substantially parallel to each other and a second set of fins that are substantially parallel to each other, and the first set of fins and the second set of fins are oriented differently according to a direction of an airflow in order to distribute the airflow substantially evenly across the substrate.

10. The heat sink of claim 8, wherein at least one heat dissipater of the plurality of heat dissipaters extends from the attachment structure in a direction away from the tab.

11. The heat sink of claim 10, wherein the at least one heat dissipater extends by a length that is substantially equal to half of a width of the substrate.

12. The heat sink of claim 1, wherein a length of the tab and a width of the substrate are configured such that the tab and the substrate have a combined width that is consistent with a width of the assembly rack.

13. The heat sink of claim 1, wherein thermally conductive adhesive is applied to thermally couple and electrically insulate the heat sink and the substrate, wherein the thermally conductive adhesive has a low thermal impedance and a high electrical resistance.

14. The heat sink of claim 1, wherein the heat sink is configured to electrically couple to the ground plane via an electrostatic discharge (ESD) protection circuit.

15. The heat sink of claim 1, wherein the substrate is associated with a solid state drive.

16. A heat sink assembly comprising:
two heat sink components each configured to mechanically couple to a respective opposing edge of a substrate, wherein each heat sink component further comprises:
an attachment structure defining a slot configured to receive the respective opposing edge of the substrate and thermally couple to a ground plane of the substrate; and
a tab located opposite to the slot, the tab being configured to slide into a respective card guide slot of an assembly rack, such that in use, heat generated by at least one electronic component on the substrate is at least partially transferred through the ground plane to the attachment structure to be dissipated.

17. The heat sink component of claim 16, wherein for each heat sink component, the respective tab has a width substantially equal to a thickness of the substrate, and extends from the respective attachment structure, thereby being configured to mate with the respective card guide slot.

18. The heat sink component assembly of claim 16, further comprising:
a plurality of heat dissipaters coupled to the attachment structure, where the heat dissipaters are configured to increase the heat dissipation area of the heat sink component and at least partially dissipate heat generated by the at least one electronic component.

19. A memory heat sink, comprising:
an attachment structure defining a slot configured to receive an edge of a memory substrate and thermally couple to a ground plane of the memory substrate; and
a tab located opposite to the slot, the tab being configured to slide into a card guide slot of an assembly rack, such that in use, heat generated by at least one memory component on the memory substrate is at least partially transferred through the ground plane to the attachment structure to be dissipated.

20. The memory heat sink of claim 19, wherein the memory substrate is associated with a solid state drive.

* * * * *